United States Patent
Descartin et al.

(10) Patent No.: US 11,923,275 B2
(45) Date of Patent: Mar. 5, 2024

(54) LEAD-FRAME ASSEMBLY, SEMICONDUCTOR PACKAGE AND METHODS FOR IMPROVED ADHESION

(71) Applicant: NXP USA, INC., Austin, TX (US)

(72) Inventors: Allen Marfil Descartin, Lapulapu (PH); Mariano Layson Ching, Jr., Tianjin (CN); Jun Li, Tianjin (CN)

(73) Assignee: NXP USA, Inc., Austin, TX (US)

( * ) Notice: Subject to any disclaimer, the term of this patent is extended or adjusted under 35 U.S.C. 154(b) by 63 days.

(21) Appl. No.: 17/458,811

(22) Filed: Aug. 27, 2021

(65) Prior Publication Data
US 2022/0415761 A1 Dec. 29, 2022

(30) Foreign Application Priority Data

Jun. 25, 2021 (CN) .......................... 202110715669.9

(51) Int. Cl.
*H01L 23/495* (2006.01)
*H01L 21/48* (2006.01)

(52) U.S. Cl.
CPC .... *H01L 23/49513* (2013.01); *H01L 21/4821* (2013.01); *H01L 23/49582* (2013.01)

(58) Field of Classification Search
CPC ............................................... H01L 23/49513
USPC ........................................................ 257/676
See application file for complete search history.

(56) References Cited

U.S. PATENT DOCUMENTS

| | | | |
|---|---|---|---|
| 6,396,129 B1 | 5/2002 | Hung et al. | |
| 6,667,073 B1 | 12/2003 | Lau et al. | |
| 2006/0097366 A1* | 5/2006 | Sirinorakul | H01L 23/495 257/E23.054 |
| 2016/0172273 A1* | 6/2016 | Ng | H01L 23/4952 257/676 |
| 2017/0025329 A1 | 1/2017 | Ishibashi et al. | |
| 2018/0096961 A1 | 4/2018 | Hashizume et al. | |

FOREIGN PATENT DOCUMENTS

DE 102005028704 A1 * 12/2006 ......... H01L 23/3142

* cited by examiner

*Primary Examiner* — Ajay Arora

(57) ABSTRACT

A lead-frame assembly is disclosed, for a semiconductor die and comprising a die attach pad and a plurality of elongate leads spaced apart therefrom; wherein each elongate lead has a first proximal end portion, a second distal end portion and a middle portion therebetween; wherein the die attach pad and each of the plurality of elongate leads each comprise a coating-free portion, and a coated portion having a coating material thereon; wherein a part of a perimeter of the die attach pad proximal each lead is comprised in the coating-free portion, and wherein the proximal end portion of each elongate lead is comprised in the coating-free portion. Associated package assemblies and methods are also disclosed.

21 Claims, 4 Drawing Sheets

LEAD-FRAME ASSEMBLY, SEMICONDUCTOR PACKAGE AND METHODS FOR IMPROVED ADHESION

CROSS-REFERENCE TO RELATED APPLICATIONS

This application claims the priority under 35 U.S.C. § 119 of China application no. 202110715669.9, filed on 25 Jun. 2021, the contents of which are incorporated by reference herein.

FIELD

The present disclosure relates to lead-frames assemblies for semiconductor die, to packaged die including such lead-frames, and to methods of manufacturing such lead-frames.

BACKGROUND

Package delamination, that is to say, delamination between one or more components of a packaged semiconductor die, is one of the primary concerns in semiconductor assembly and packaging. The issue is of particular concern for semiconductors which are intended for use in harsh environmental conditions, such as for the automotive industry in which the semiconductor packages may be exposed to high temperatures and/or high levels of mechanical stress over a relatively long lifetime of up to 20 years. Semiconductor package assembly, for the automotive sector in particular, requires a stringent set of stress tests. The adhesion strength between the lead-frame, and the epoxy moulding compound (EMC) is an important characteristic to mitigate the presence of possibility of delamination. One possible cause of delamination is a failure of the bonding between the lead-frame plated area—typically a silver-plated area—which may propagate to the location of a wirebond such as a stitch bond, for a wirebond connection between the lead and the semiconductor die, causing the bond to fail, or the package to partially delaminate.

SUMMARY

According to a first aspect of the present disclosure, there is provided a lead-frame assembly, for a semiconductor die and comprising a die attach pad and a plurality of elongate leads spaced apart therefrom; wherein each elongate lead has a first proximal end portion, a second distal end portion and a middle portion therebetween; wherein the die attach pad and each of the plurality of elongate leads each comprise a coating-free portion, and a coated portion having a coating material thereon; and wherein the proximal end portion of each elongate lead is comprised in the coating-free portion. According to one or more embodiments, a part of a perimeter of the die attach pad proximal each lead is comprised in the coating-free portion.

By leaving the end of each lead which is proximal to the die attach pad un-coated, and optionally at least a part of the perimeter of the die attach pad also uncoated, an area of the lead-frame assembly's base or substrate material is exposed and available to be in direct contact with the epoxy moulding compound, also known as encapsulant moulding compound (EMC). A bond between the EMC and the substrate material, which is typically copper, may thereby be established. Directly bonding the end portions of the base or substrate material of the leads and the die attach pad to the EMC precludes the possibility of delamination of the lead die attach pad from the coating (since no coating is present) in these regions, thereby reducing the overall risk to delamination within the assembly.

According to one or more embodiments, the coating material completely covers the coated portion of the die attach pad and completely coats the coated portion of each of the plurality of elongate leads. Delamination which might otherwise occur at the end of the lead which is proximal to the die attach pad may thereby be prevented.

According to one or more embodiments, the coating material incompletely covers the coated portion of the die attach pad. Incomplete coverage across the coated portion may allow the epoxy moulding compound to directly contact the base substrate material in gaps between the coating. This may enhance the adhesion between the EMC and the die attach pad. Similarly, in one or more embodiments the coating material incompletely covers the coated portion of each of the plurality of elongate leads. Similar benefits may thereby ensue.

According to one or more embodiments, the incomplete coverage comprises a plurality of microdots of the coating material. The microdots may adjoin or abut one another or may be separated or isolated from each other. There may thus be a gap between some or all of the microdots. According to one or more embodiments, the coating material is a plated material. It may be an electroplated material, or in the alternative it may be an electroless plated material. In general, as will be familiar to the skilled person, plated material, whether electroplated or electrolessly, is identifiable by the grain structure and size of the material. Alternatively and without limitation, the material may be deposited by other means such as sputtering. The skilled person will appreciate that sputtered material may typically be identifiable, by means of its grain size and structure.

According to one or more embodiments the coating material is silver. Other materials may be used for the coating, but silver is a particularly suited for the application, in particular because it is a relatively soft metal so is easily deformed and bonded, together with having a high electrical conductivity. According to one or more embodiments, the die-attach pad and the elongate leads are copper. Copper is well known for lead-frame material, because of its mechanical properties, together with having a high electrical conductivity. According to one or more embodiments, the coating is on a first major surface of the lead-frame assembly. The lead-frame may have a second major surface, wherein the entirety of the second major surface is coating-free. Coating only a portion of the first major surface (that is to say, the top surface in the "normal" configuration wherein the die is to be positioned on top of the lead-frame), and leading the bottom surface un-coated, minimises the use of the coating material and thus helps reduce the material cost (also referred to as the "bill of materials") for the assembly as a whole.

According to a second aspect of the present disclosure, there is provided a packaged semiconductor die, comprising the lead-frame assembly as discussed above, a semiconductor die attached to the die attach pad, a plurality of wirebonds between the semiconductor die and the coated portion of the die attach pad, and a plurality of wirebonds between the semiconductor die and the leads. Such a packaged semiconductor die may prove to be more robust and/or reliable, due to a reduced risk delamination within the package, than conventionally packaged semiconductor die.

According to a third aspect of the present disclosure, there is disclosed a method of making a lead-frame assembly, the method comprising: providing a die attach pad and a plurality of elongate leads spaced apart therefrom, wherein each elongate lead has a first proximal end portion, a second distal end portion and a middle portion therebetween; and coating a portion of the die attach pad and each of the plurality of elongate leads with a coating material, and leaving a coating-free portion coating-free, wherein a part of a perimeter of the die attach pad proximal each lead is comprised in the coating-free portion, and wherein the proximal end portion of each elongate lead is comprised in the coating-free portion.

According to one or more embodiments, coating a portion of the die attach pad and each of the plurality of elongate leads comprises electroplating. Electroplating is a particularly convenient method of depositing some electrically conductive metals such as silver. In other embodiments the coating may be carried out by electroless plating, or other deposition techniques.

According to one or more embodiments, the step of coating the portion of the die attach pad and each of relative elongate leads comprises coating them with a plurality of microdots. The coating material may silver.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
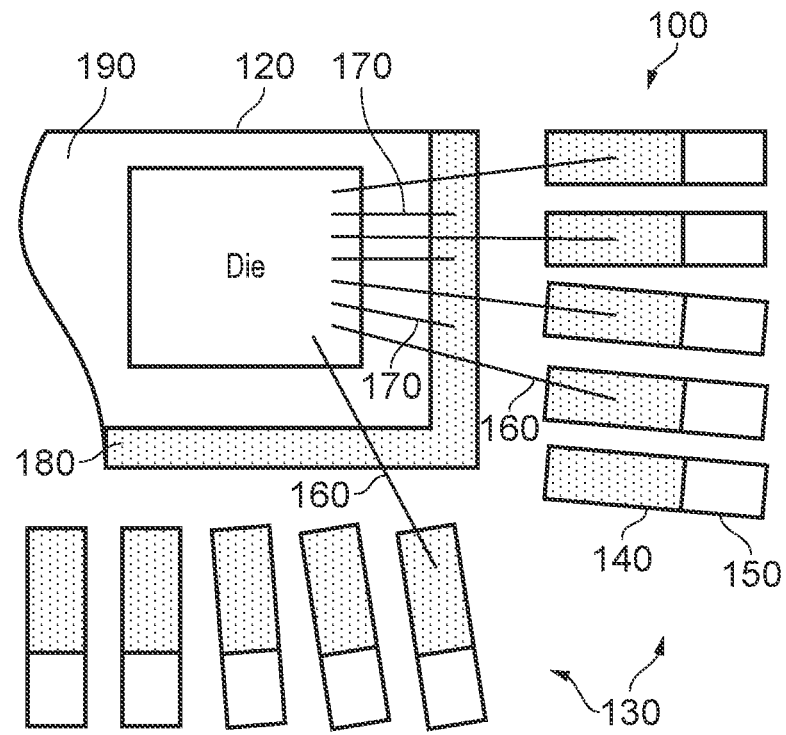
FIG. 1 illustrates, schematically, a part of a known lead-frame assembly with a semiconductor die attached, prior to epoxy moulding.

It should be noted that the figures are diagrammatic and not drawn to scale. Relative dimensions and proportions of parts of these figures have been shown exaggerated or reduced in size, for the sake of clarity and convenience in the drawings. The same reference signs are generally used to refer to corresponding or similar features in modified and different embodiments

DETAILED DESCRIPTION OF EMBODIMENTS

FIG. 1 illustrates, schematically, a part of a known lead-frame assembly 100 with a semiconductor die 110 attached, prior to epoxy moulding. The lead-frame assembly 100 comprises a die attach pad 120, and a plurality of leads 130, spaced apart therefrom. Note that the die attach pad may alternatively be described as a die attach pad, or DAP. Each lead 130 is generally elongate, having a first portion 140 which is closer to the die attach pad 120 than a second portion 150. Various configurations of the leads will be familiar to the skilled person, such as a "fan-out" arrangement generally as shown, in which the ends of the leads which are distal from the die attach pad are, more widely spaced apart than the ends of the leads which are proximal to the die attach pad. In other configuration, the leads may be parallel, to each other, or have two or more groups (one group approaching the die attach pad more closely than another group).

Whereas the second portion 150 of the lead which is more remote from the die attach pad is uncoated, the first portion 140 has a coating thereon. The coating is provided to improve the bonding of wires 160, which are bonded to the leads. Typically, the leads themselves are made from copper, and the coating is silver, although the coating may be another material which is compatible with bonding, such as, without limitation, gold, nickel or palladium. The plating is typically achieved by electroplating. Whereas the copper leads have higher electrical conductivity than the silver plating, as will be familiar to the skilled person, the silver surface generally provides better, that is to say stronger and/or more reliable, bonds with the wires 160. Wires 160 typically, but not necessarily, are gold.

Turning now to the die attach pad 120, this is formed from the same material as the leads—that is to say the base material of the die attach pad is also typically copper. In practice the lead-frame assembly is typically formed from a reel of copper, and is stamped to provide the both the die attach pad, and the leads which at this stage process are still connected to the die attach pad: the connections are cut later in the process in order to electrically isolate the lead from the die attach pad. Again, similar to the leads, a part 180 of the surface of the die attach pad is coated to improve the bonding of wires 170 from the semiconductor die to the die attach pad. A central region 190 of the die attach pad, to which the die is attached, is typically left uncoated, although in some embodiments the central region may include a coating, if appropriate for the device or application for instance to meet electrical conductivity requirements. The coated portion thus is around the perimeter of the die attach pad. Again, the coating is silver typically achieved by an electroplating process, although other processes, such as electroless plating, may alternatively be used.

Figure 2:
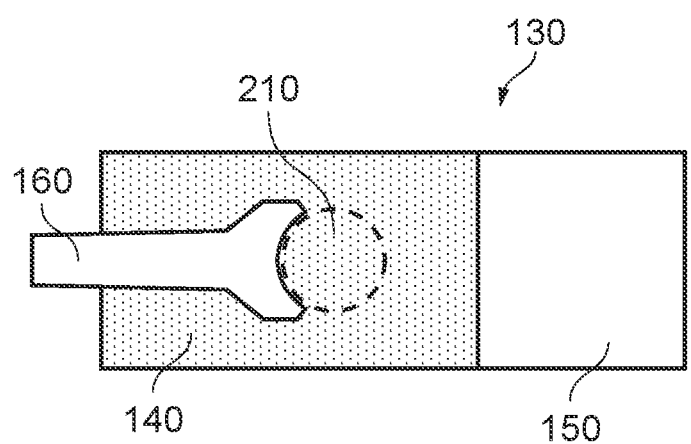
FIG. 2 shows a more detailed schematic view of a stitch-bond onto a lead being part of the known lead-frame assembly of FIG. 1.

FIG. 2 shows the detail of the stitch bond 210 between a wire 160 and a lead 130, FIG. 1. As will be familiar to the skilled person, the wire 160 is pressed against the lead 130, thereby deforming the wire 160 such that it is wider at the position of the bond. The "flattened" wire is bonded to the coating material by means of a compression bond. Other variants of wire bonding, such as ball-bonding, with or without the use of either heat or ultrasonic vibration, may be used. Since the site of the bond is stressed during the bonding process, it represents a vulnerable region for delamination. Furthermore, since the bond location is relatively close to the proximal end of the lead (typically within 100 to 300 µm), there could be a further risk to delamination between the coating and the base material of the lead initiating at the end of the leads.

Figure 3:
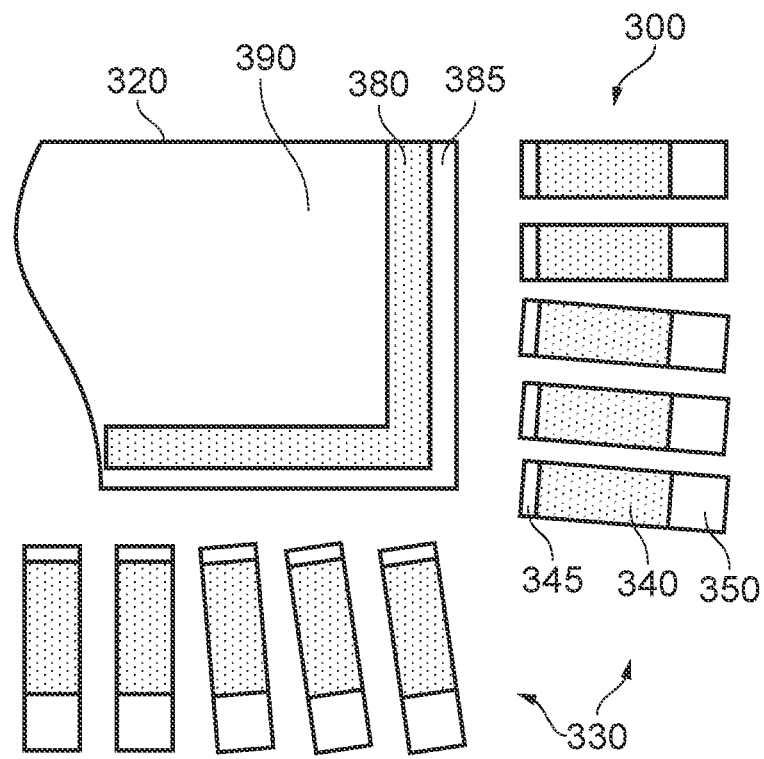
FIG. 3 illustrates, schematically, a part of a lead-frame assembly with a semiconductor die attached, prior to epoxy moulding, according to one or more embodiments.

FIG. 3 illustrates, schematically, a part of a lead-frame assembly 300, prior to die attach and epoxy moulding, according to one or more embodiments. The lead-frame assembly includes a die attach pad 320 and a plurality of elongate leads 330. Each of the elongate leads has a coated portion 340, which is closer to the die attach pad than is an uncoated portion 350 at the remote or distal end of the lead. However, the coated portion does not extend to the end of the lead which is closest to the pad. The coated portion 340 is spaced apart from the end of the lead which is closest to the die attach pad, by a proximal end portion 345. The coated portion has a coating of a coating material, which is typically silver. Although other known techniques or processes may be used, the coating material may typically be applied to the lead by plating and in particular by electroplating. By limiting or constraining the coating region to the central, or middle, portion of the lead, it may be possible to enhance the adhesion between the epoxy moulding compound and the lead and in particular to reduce the risk of delamination within the layers of the lead, since at the end of the lead there is no coating layer.

In a similar fashion, in the embodiment shown in FIG. 3, the die attach pad 320 includes a central region 390, to which the semiconductor die will be attached and which is not coated, together with a coated portion 380, which is provided for bonding of wires from the semiconductor die to the die attach pad, for instance to provide a ground plane. However, the coated portion 380 does not extend to the edge of the die attach pad, but rather is spaced therefrom by a perimeter region 385. Leaving the perimeter of the die attach pad uncoated has the same or a similar effect as leaving the proximal ends of the leads uncoated: the EMC bonds directly to the base or substrate material of the frame assembly, and the risk of delamination within the lead-frame assembly initiating at the edge of the die attach pad is eliminated since there is no coating layer.

As shown in FIG. 3, the complete perimeter of the die attach pad may be left uncoated. in one or more other embodiments, only a part of the perimeter is left uncoated. The uncoated part of the perimeter comprise the entirety of one or more edges of the perimeter, or may form individual notches along one or more edges of the perimeter (not shown). In particular, but without limitation, the uncoated part of the perimeter may correspond to the locations at which wire bonds are made.

Figure 4:
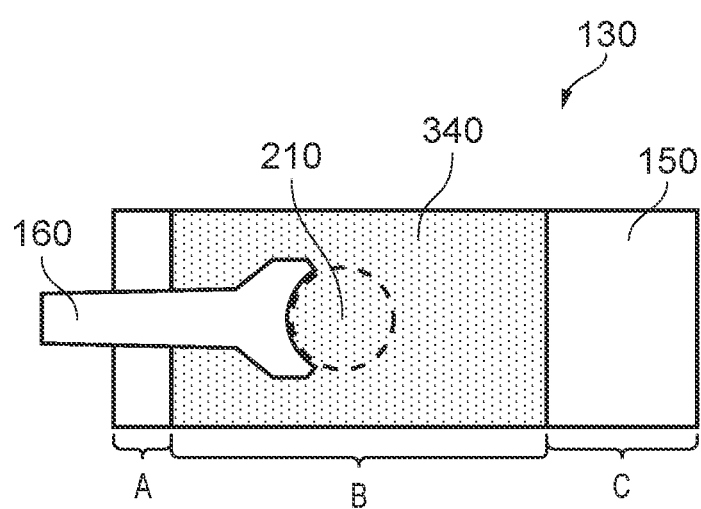
FIG. 4 shows a more detailed schematic view of a stitch-bond onto a lead being part of the known lead-frame assembly of FIG. 3.

FIG. 4 shows the detail of the stitch bond 210 between a wire 160 and a lead 130, for the lead-frame assembly shown in FIG. 3, at a later stage of the processing. The length of the uncoated proximal end region, that is to say the distance or separation "A" between the proximal end of the lead and the coated region, may be implementation specific, but this may typically have a value in the range between 50 and 500 µm, and may preferably have a range between 100 and 300 µm. The length of the coated region, that is to say the length "B" shown in FIG. 4, will depend on the particular implementation, but may typically have a range between 200 and 2000 µm, and may preferably have a range between 200 and 1000 µm. Finally, the length of the distal end portion 150, that is to say the length "C" shown in FIG. 4 will depend on the particular implementation, and in particular the size of the die, the package, and the length of lead protrusion from the package, but may typically have a range between 1 and 4 mm.

Figure 5:
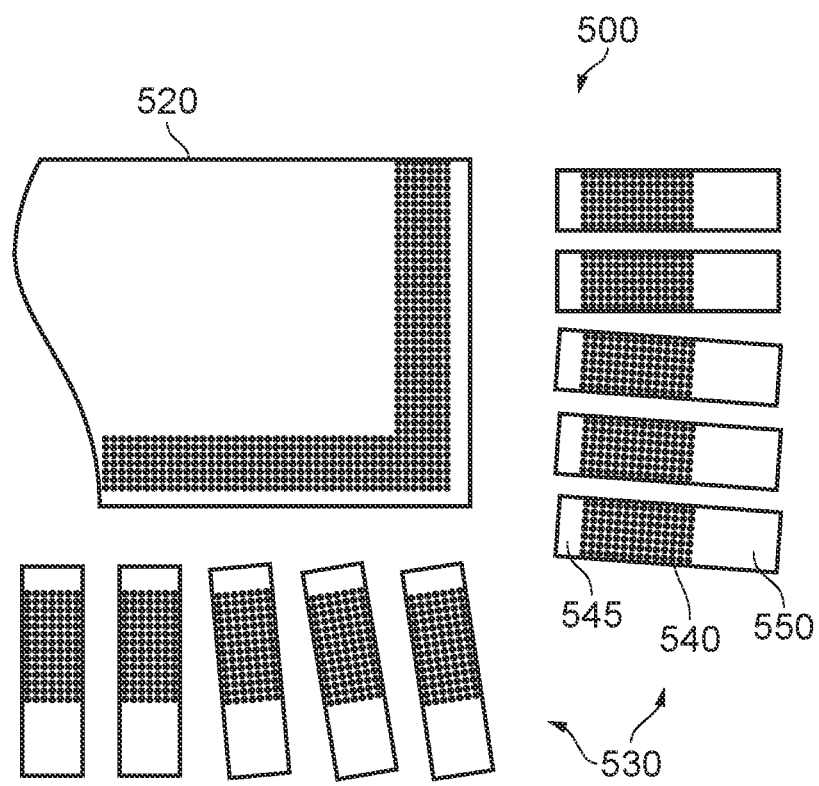
FIG. 5 illustrates, schematically, a part of a lead-frame assembly with a semiconductor die attached, prior to epoxy moulding, according to one or more other embodiments.

FIG. 5 illustrates, schematically, a part of a lead-frame assembly 500, prior to die attach and epoxy moulding, according to one or more other embodiments. The lead-frame assembly includes a die attach pad 520 and a plurality of elongate leads 530. Each of the elongate leads has a coated portion 540, which is closer to the die attach pad than is an uncoated portion 550 at the remote or distal end of the lead. The coated portion does not extend to the end of the lead which is closest to the pad. The coated portion 540 is spaced apart from the end of the lead which is closest to the die attach pad, by a proximal end portion 545. The coated portion has a coating of a coating material, which is typically silver. Although other known techniques or processes may be used, the coating material may typically be applied to the lead by plating and in particular by electroplating. However, in embodiments as shown, the coated portion of the lead is not entirely, or completely, covered by the coating material. Instead, coated region is only partially covered. The partial covering may comprise a layer of the coating material with holes therein, or may, as shown be a plurality of discrete regions or microdots, with spacing therebetween. The dimensions and shape or shapes of the of the microdots may vary between implementations, but the microdots typically may typically be generally circular or elliptical with a major diameter in a range between 1 and 50 µm preferably in a range between 2 and 10 µm. In general, a smaller size is preferred, and the microdots may be even smaller. The separation spacing between the microdots is again implementation specific, but maybe typically in the range of 0 to 10 µm. A small spacing may be preferred. Providing or only partial coating in the coated portion facilitates a direct bond between the EMC and the base substrate layer even in the region of the wirebond. This may eliminate or reduce delamination. Furthermore, in embodiments in which the coating is provided as a plurality of discrete regions of microdots, the impact of partial delamination may be suppressed. Even if a single microdots or discrete region of the coating delaminates from the base substrate material of the lead, the individual nature of the microdots, and/or the separation or spacing between the microdots may have a technical advantage that the delamination cannot propagate beyond that microdot.

In a similar fashion, in the embodiment shown in FIG. 5, the die attach pad 520 includes a central region 590, to which the semiconductor die will be attached and which is not coated, together with a coated portion 580, which is provided for bonding of wires from the semiconductor die to the die attach pad, for instance to provide a ground plane. The coated portion 580 does not extend to the edge of the die attach pad, but rather is spaced therefrom by a perimeter region 585, in order to facilitate the EMC bonding directly to the base or substrate material of the frame assembly, and the risk of delamination within the lead-frame assembly initiating at the edge of the die attach pad is eliminated since there is no coating layer.

Figure 6:
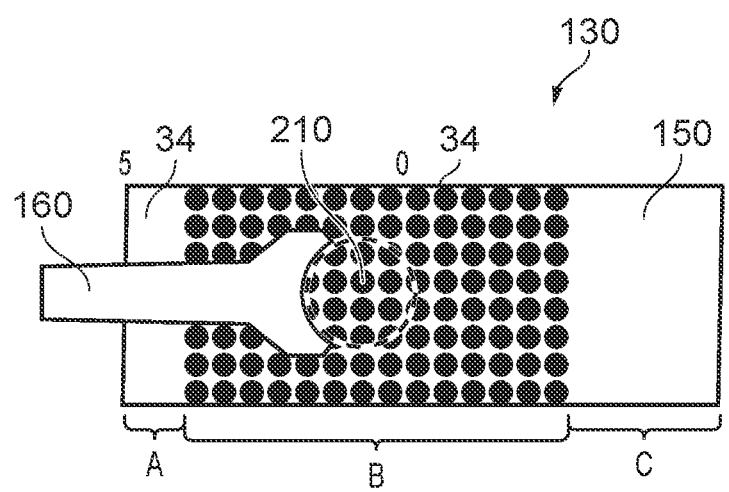
FIG. 6 shows a more detailed schematic view of a stitch-bond onto a lead being part of the known lead-frame assembly of FIG. 5.

FIG. 6 shows the detail of the stitch bond 210 between a wire 160 and a lead 130, for the lead-frame assembly shown in FIG. 5, at a later stage of the processing. As can be seen from the figure, particular as the wirebond flattens the wire such that the bond area is more extensive than the diameter of the wire, the bond site crosses many microdots; in order to ensure the integrity of the bond the percentage coverage of the coating should be adequately high. In general this means that it is preferable to ensure that the coating has at least 30% coverage, and preferably greater than 50% coverage.

Figure 7:
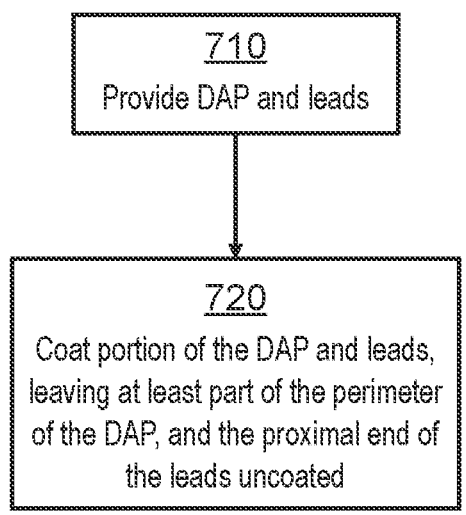
FIG. 7 shows a flow diagram of a method of making a lead-frame according to one or more embodiments.

FIG. 7 shows a flow diagram of a method of making a lead-frame assembly according to one or more embodiments of the present disclosure. The first step of the method is 710 Provide DAP and leads. This step comprises providing a die attach pad and a plurality of elongate leads spaced apart therefrom, wherein each elongate lead has a first proximal end portion, a second distal end portion and a middle portion therebetween. A further step of the method is 720 coat portion of the DAP and leads, leaving at least part of the perimeter of the DAP, and the proximal end of the leads uncoated. This step comprises coating a portion of the die attach pad and each of the plurality of elongate leads with a coating material, and leaving a coating-free portion coating-free. In this method, a part of a perimeter of the die attach pad proximal each lead is comprised in the coating-free portion, and the proximal end portion of each elongate lead is comprised in the coating-free portion.

In embodiments in which the coated portion of the leads and die attach pad coated with a microdot array, various mechanisms may be used to achieve the array. As a first nonlimiting example, a continuous and complete layer may first be deposited, and then part or parts of the layout may be selectively etched away by known processes (such as using a photolithographic technique to mask the regions or areas to be retained). This process may generally referred to as subtractive photolithography. As a second nonlimiting example, a pattern may be first be defined by photolithographic techniques, and the coating material deposited into the defined pattern only, by one of a variety of processes, with which the skilled person will generally be familiar, and include electroplating, electroless plating, evaporation or sputtering. This process may generally be referred to as additive photolithography. As a third nonlimiting example, individual microdots of the coating material may be separately formed, for example as small particles, which are then used to bombard the respective portions of the leads and the die attach pad.

From reading the present disclosure, other variations and modifications will be apparent to the skilled person. Such variations and modifications may involve equivalent and other features which are already known in the art of the frame assemblies, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. A lead-frame assembly, for a semiconductor die and comprising
   a die attach pad and a plurality of elongate leads spaced apart therefrom;
   wherein the semiconductor die is attached to a central region of the die attach pad;
   wherein each elongate lead has a first proximal end portion, a second distal end portion and a middle portion therebetween;
   wherein the die attach pad and each of the plurality of elongate leads each comprise a coating-free portion, and a coated portion having a coating material thereon;
   wherein the proximal end portion of each elongate lead is comprised in the coating-free portion; and
   wherein the coating material comprises a plurality of microdots which incompletely covers the coated portion of the die attach pad or the coated portion of one or more of the plurality of elongate leads, wherein a diameter of each microdot is 50 μm or smaller and each microdot extends above a surface of the coated portion surrounding that microdot.

2. The lead-frame assembly of claim 1, wherein a part of a perimeter of the die attach pad proximal each lead is comprised in the coating-free portion.

3. The lead-frame assembly of claim 1, wherein the coating material incompletely covers the coated portion of the die attach pad.

4. The lead-frame assembly of claim 1, wherein the coating material incompletely covers the coated portion of each of the plurality of elongate leads.

5. The lead-frame assembly of claim 1, wherein the coating is on a top surface of the lead-frame assembly.

6. A packaged semiconductor die, comprising:
   a lead-frame assembly including:
      a die attach pad and a plurality of elongate leads spaced apart therefrom;
      wherein each elongate lead has a first proximal end portion, a second distal end portion and a middle portion therebetween;
      wherein the die attach pad and each of the plurality of elongate leads each comprise a coating-free portion, and a coated portion having a coating material thereon; and
      wherein the proximal end portion of each elongate lead is comprised in the coating-free portion;
   wherein the packaged semiconductor die further comprises:
      a semiconductor die attached to the die attach pad;
      a plurality of wirebonds between the semiconductor die and the coated portion of the die attach pad; and
      a plurality of wirebonds between the semiconductor die and the leads; and
   wherein the coating material comprises a plurality of microdots which incompletely covers the coated portion of the die attach pad or the coated portion of one or more elongate lead of the plurality of elongate leads, wherein a diameter of each microdot is 50 μm or smaller and each microdot extends above a surface of the coated portion surrounding that microdot.

7. A method of making a lead-frame assembly, the method comprising:
   providing a die attach pad and a plurality of elongate leads spaced apart therefrom, wherein each elongate lead has a first proximal end portion, a second distal end portion and a middle portion therebetween; and
   coating a portion of the die attach pad and each of the plurality of elongate leads with a coating material, and leaving a coating-free portion coating-free;
   wherein a part of a perimeter of the die attach pad proximal each lead is comprised in the coating-free portion;
   wherein the proximal end portion of each elongate lead is comprised in the coating-free portion; and
   wherein the coating material comprises a plurality of microdots which incompletely cover the coated portion of the die attach pad or the coated portion of one or more elongate lead of the plurality of elongate leads, wherein a diameter of each microdot is 50 μm or smaller and each microdot extends above a surface of the coated portion surrounding that microdot.

8. The method of claim 7, wherein the step of coating the portion of the die attach pad and each of relative elongate leads comprises coating them with the plurality of microdots.

9. The packaged semiconductor die of claim 6, wherein a part of a perimeter of the die attach pad proximal each lead is comprised in the coating-free portion.

10. The packaged semiconductor die of claim 6, wherein the coating material incompletely covers the coated portion of the die attach pad.

11. The packaged semiconductor die of claim 6, wherein the coating material incompletely covers the coated portion of each of the plurality of elongate leads.

12. A lead-frame assembly comprising:
a semiconductor die;
a die attach pad and a plurality of elongate leads spaced apart therefrom, a backside of the semiconductor die attached to the die attach pad;
wherein each elongate lead has a first proximal end portion, a second distal end portion and a middle portion therebetween;
wherein the die attach pad and each of the plurality of elongate leads each comprise a coating-free portion, and a coated portion having a coating material thereon;
wherein the proximal end portion of each elongate lead is comprised in the coating-free portion; and
wherein the coating material comprises a plurality of microdots which incompletely cover the coated portion of the die attach pad or the coated portion of one or more elongate lead of the plurality of elongate leads, wherein a diameter of each microdot is 50 µm or smaller, and each microdot extends above a surface of the coated portion surrounding that microdot.

13. The lead-frame assembly of claim 12, wherein a part of a perimeter of the die attach pad proximal each lead is comprised in the coating-free portion.

14. The lead-frame assembly of claim 12, wherein the coated portions of the die attach pad and each of the plurality of elongate leads comprise a portion of the plurality of microdots of the coating material.

15. The lead-frame assembly of claim 12, wherein the coating material is applied on a top surface of the lead-frame assembly.

16. A lead-frame assembly, for a semiconductor die and comprising
a die attach pad and a plurality of elongate leads spaced apart therefrom;
wherein the semiconductor die is attached to a central region of the die attach pad;
wherein each elongate lead has a first proximal end portion, a second distal end portion and a middle portion therebetween;
wherein the die attach pad and each of the plurality of elongate leads each comprise a coating-free portion, and a coated portion having a coating material thereon;
wherein the proximal end portion of each elongate lead is comprised in the coating-free portion;
wherein the coating material comprises a plurality of microdots which incompletely cover the coated portion of one or more of the elongate leads of the plurality of elongate leads and each microdot extends above a surface of the coated portion surrounding that microdot.

17. The lead-frame assembly of claim 16, wherein each microdot has a diameter between 1 and 50 µm.

18. A packaged semiconductor die, comprising:
a lead-frame assembly including:
a die attach pad and a plurality of elongate leads spaced apart therefrom;
wherein each elongate lead has a first proximal end portion, a second distal end portion and a middle portion therebetween;
wherein the die attach pad and each of the plurality of elongate leads each comprise a coating-free portion, and a coated portion having a coating material thereon; and
wherein the proximal end portion of each elongate lead is comprised in the coating-free portion;
wherein the packaged semiconductor die further comprises:
the semiconductor die attached to the die attach pad;
a first plurality of wirebonds between the semiconductor die and the coated portion of the die attach pad; and
a second plurality of wirebonds between the semiconductor die and the plurality of elongate leads; and
wherein the coating material comprises a plurality of microdots which incompletely cover the coated portion of one or more of the elongate leads of the plurality of elongate leads and each microdot extends above a surface of the coated portion surrounding that microdot.

19. The packaged semiconductor die of claim 18,
wherein the coating material comprises a plurality of microdots which incompletely cover the coated portion of the die attach pad; and
wherein the first plurality of wirebonds includes a first plurality of wirebond ends coupled to the coated portion of the die attach pad and each wirebond end of the first plurality of wirebond ends is bonded to multiple microdots.

20. The packaged semiconductor die of claim 18 wherein each microdot has a diameter between 1 and 50 µm.

21. The packaged semiconductor die of claim 18,
wherein the second plurality of wirebonds includes a second plurality of wirebond ends coupled to the coated portion of a corresponding elongate lead and each of the second plurality of wirebond ends is bonded to multiple microdots within the coated portion of the corresponding elongate lead.

* * * * *